US009728620B2

(12) United States Patent
Zhou

(10) Patent No.: US 9,728,620 B2
(45) Date of Patent: Aug. 8, 2017

(54) SEMICONDUCTOR DEVICE HAVING METAL GATE STRUCTURE AND FABRICATION METHOD THEREOF

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/831,247

(22) Filed: Aug. 20, 2015

(65) Prior Publication Data

US 2016/0064506 A1 Mar. 3, 2016

(30) Foreign Application Priority Data

Aug. 26, 2014 (CN) .......................... 2014 1 0425850

(51) Int. Cl.
| *H01L 29/66* | (2006.01) |
| *H01L 29/49* | (2006.01) |
| *H01L 29/51* | (2006.01) |
| *H01L 29/423* | (2006.01) |
| *H01L 21/28* | (2006.01) |
| *H01L 21/321* | (2006.01) |
| *H01L 23/532* | (2006.01) |
| *H01L 21/768* | (2006.01) |

(52) U.S. Cl.
CPC .... *H01L 29/4966* (2013.01); *H01L 21/28088* (2013.01); *H01L 21/321* (2013.01); *H01L 29/42372* (2013.01); *H01L 29/517* (2013.01); *H01L 29/66545* (2013.01); *H01L 29/66871* (2013.01); *H01L 21/76846* (2013.01); *H01L 21/76856* (2013.01); *H01L 23/53223* (2013.01)

(58) Field of Classification Search
CPC ......... H01L 29/66545; H01L 29/66871; H01L 51/0516; H01L 51/0529
See application file for complete search history.

(56) References Cited

U.S. PATENT DOCUMENTS

| 6,635,939 B2 | 10/2003 | Agarwal et al. |
| 6,727,560 B1 * | 4/2004 | Pan .................... H01L 21/28088 257/388 |
| 2007/0264444 A1 * | 11/2007 | Otsuki ................ C23C 16/4405 427/576 |

(Continued)

Primary Examiner — Phat X Cao
(74) Attorney, Agent, or Firm — Anova Law Group, PLLC

(57) ABSTRACT

The present disclosure provides a semiconductor device including a metal gate structure and formation method thereof. The semiconductor device includes a substrate and a dielectric layer disposed on the substrate. The dielectric layer includes a trench. A diffusion barrier layer is disposed over a bottom surface and sidewall surfaces of the trench in the dielectric layer. The diffusion barrier layer includes at least a titanium-nitride stacked layer. The titanium-nitride stacked layer includes a TiNx layer disposed over the bottom surface and the sidewall surfaces of the trench, a TiN layer on the TiNx layer, and a TiNy layer on the TiN layer, x<1 and y>1. A metal gate is filled in the trench and disposed on the diffusion barrier layer.

12 Claims, 9 Drawing Sheets

(56) References Cited

U.S. PATENT DOCUMENTS

2013/0026578 A1* 1/2013 Tsau ................ H01L 21/823842
  257/368
2013/0026579 A1* 1/2013 Lu ...................... H01L 27/1104
  257/369

* cited by examiner

_(US 9,728,620 B2)_

SEMICONDUCTOR DEVICE HAVING METAL GATE STRUCTURE AND FABRICATION METHOD THEREOF

CROSS-REFERENCES TO RELATED APPLICATIONS

This application claims the priority of Chinese patent application No. 201410425850.6, filed on Aug. 26, 2014, the entirety of which is incorporated herein by reference.

FIELD OF THE DISCLOSURE

The present disclosure generally relates to the field of semiconductor fabrication technologies and, more particularly, relates to semiconductor devices having a metal gate structure and formation methods.

BACKGROUND

The continuous advancement of semiconductor technology results in ever increasing integration density of semiconductor devices. The critical dimension (CD) of semiconductor devices is getting smaller. This requires greater transistor performance.

In transistors, because the polysilicon gate exhibits relatively high resistance, metal materials have been used as a gate material. The low resistance of metal gate improves transistor performance. The CMOS transistor metal gate is often formed using a gate last process to prevent the metallic material of metal gate from inadvertently affecting the overall structure of transistors.

As shown in FIG. 1, a conventional gate last process includes: forming a dummy gate (such as polysilicon) on a semiconductor substrate. After the source/drain regions 13 are formed, a dielectric layer 11 is formed on the substrate and the dummy gate is removed to form a gate trench 12 in the dielectric layer 11. Subsequently, as shown in FIG. 2, metallic material fills the gate trench 12 to form a metal gate 15.

As shown in FIG. 1, in order to prevent the metal atoms of metal gate from diffusing into the dielectric layer 11 to degrade the performance of the subsequently formed semiconductor device, before filling metallic material into the gate trench 12, a diffusion barrier layer 14 is formed on sidewall surfaces of the gate trench 12 to reduce diffusion of metal atoms from the metal gate 15 into the dielectric layer 11.

However, conventional diffusion barrier layers become insufficient to meet demanding requirements of semiconductor devices. Hence, it is desirable to provide semiconductor devices and formation methods to reduce or eliminate the diffusion of metal atoms.

SUMMARY

One aspect or embodiment of the present disclosure provides a semiconductor device including a metal gate structure. The semiconductor device includes a substrate and a dielectric layer disposed on the substrate. The dielectric layer includes a trench. A diffusion barrier layer is disposed over a bottom surface and sidewall surfaces of the trench in the dielectric layer. The diffusion barrier layer includes at least a titanium-nitride stacked layer. The titanium-nitride stacked layer includes a TiNx layer disposed over the bottom surface and the sidewall surfaces of the trench, a TiN layer on the TiNx layer, and a TiNy layer on the TiN layer, x<1 and y>1. A metal gate is filled in the trench and disposed on the diffusion barrier layer.

Another aspect or embodiment of the present disclosure provides a method for fabricating a semiconductor device. In the method, a dielectric layer is formed on a substrate. A trench is formed in the dielectric layer. A diffusion barrier layer is formed over a bottom surface and sidewall surfaces of the trench in the dielectric layer. The diffusion barrier layer includes at least a titanium-nitride stacked layer. The titanium-nitride stacked layer includes a TiNx layer disposed over the bottom surface and the sidewall surfaces of the trench, a TiN layer on the TiNx layer, and a TiNy layer on the TiN layer, x<1 and y>1. A metal gate is filled in the trench and disposed on the diffusion barrier layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
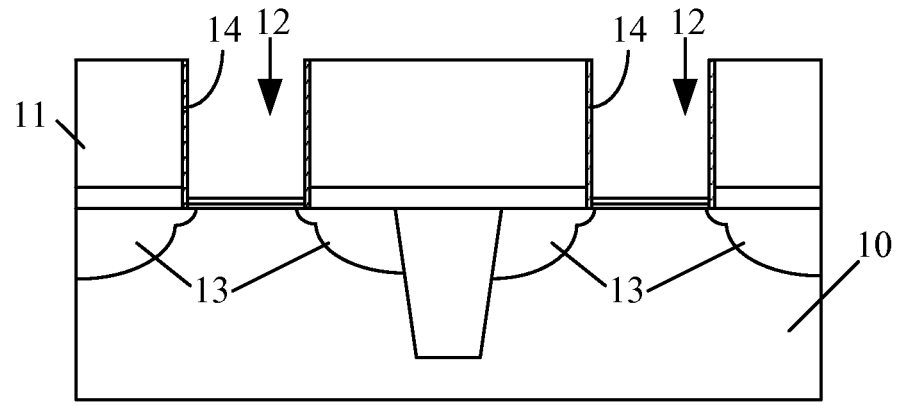
FIGS. 1-2 are schematic diagrams illustrating a conventional method for forming a metal gate.
Figure 2:
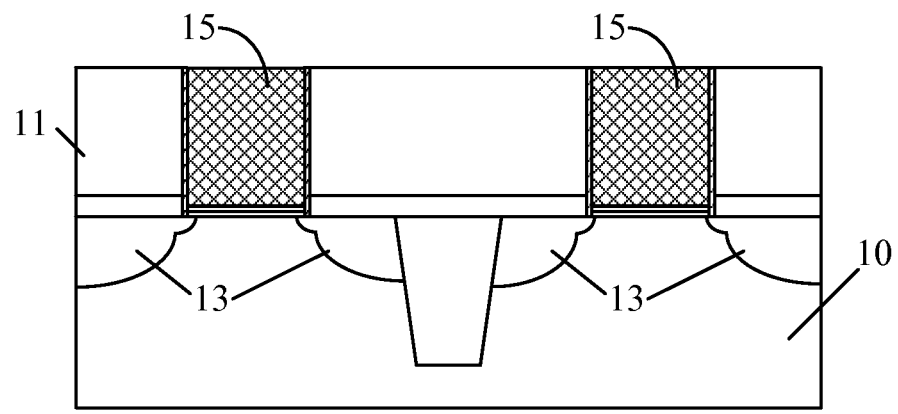

Reference will now be made in detail to exemplary embodiments of the disclosure, which are illustrated in the accompanying drawings. Wherever possible, the same reference numbers will be used throughout the drawings to refer to the same or like parts.

In a semiconductor device including a metal gate structure, a diffusion barrier layer may be formed between a dielectric layer and a metal gate to suppress metal atom diffusion from the metal gate into the dielectric layer and to improve performance of the resultant semiconductor device. With the advancement of the semiconductor technology, conventional diffusion barrier layer has limited effect on suppressing the metal atom diffusion from the metal gate into the dielectric layer, and is unable to satisfy the requirements based on the semiconductor technology advancement.

The present disclosure provides a semiconductor device including a metal gate structure and a formation method thereof. For example, a metal gate structure may include a diffusion barrier layer formed over/on inner surfaces (including a bottom surface and sidewall surfaces) of a trench within a dielectric layer. The diffusion barrier layer includes a titanium-nitride stacked layer including multiple layers of a TiNx (e.g., having a ratio of Ti:N as 1:x, with x<1) layer, a TiN (e.g., having a ratio of Ti:N as 1:1) layer, and a TiNy (e.g., having a ratio of Ti:N as 1:y, with y>1) layer. In some cases, the titanium-nitride stacked layer may be a single layer formed by a TiNx (x<1) layer, a TiN layer, and a TiNy (y>1) layer. For example, the TiNx (x<1) layer is disposed over/on the inner surfaces of the trench, the TiN layer is on the TiNx layer, and the TiNy layer is on the TiN layer.

Compared with conventional diffusion barrier layer, the disclosed titanium-nitride stacked layer can more effectively reduce metal atom diffusion from the metal gate into the dielectric layer. The disclosed diffusion barrier layer provides desirable diffusion barrier capability and improves performance of the subsequently formed semiconductor device.

The present disclosure provides a semiconductor device including a metal gate structure and formation method thereof to more effectively suppress diffusion of metal atoms from the metal gate. An exemplary metal gate structure can include a substrate, a dielectric layer on the surface of the substrate, and a trench in the dielectric layer. A diffusion barrier layer is formed on inner surfaces (including bottom surface and sidewall surfaces) of the trench in the dielectric layer. The diffusion barrier layer includes at least a titanium-nitride stacked layer of TiNx, TiN, and TiNy, with x<1 and y>1. A metal gate is formed in the trench.

Optionally, the diffusion barrier layer includes a first titanium nitride layer, a second titanium nitride layer, and a third titanium nitride layer. The first titanium nitride layer includes the TiNx (x<1) layer, the second titanium nitride layer includes the TiN layer, and the third titanium nitride layer includes the TiNy (y>1) layer.

Optionally, the thickness of each of the first titanium nitride layer, the second titanium nitride layer, and the third titanium nitride layer is between about 5 Å and about 60 Å. The diffusion barrier layer also includes a titanium aluminum nitride layer on the surface of the titanium-nitride stacked layer. The thickness of the titanium aluminum nitride layer is between about 5 Å and about 50 Å. In some embodiments, the diffusion barrier layer also includes a tantalum (Ta) layer covering surfaces of the sidewalls and bottom of the trench. The titanium-nitride stacked layer covers the surface of the tantalum (Ta) layer. In other embodiments, the diffusion barrier layer also includes a tantalum nitride (TaN) layer formed between the tantalum (Ta) layer and the titanium-nitride stacked layer.

Optionally, the metal gate structure also includes a high K dielectric layer used as a gate dielectric layer. The high K dielectric layer is formed on the bottom of the trench and under the diffusion barrier layer. In one embodiment, the metal gate is an aluminum gate.

The present disclosure also provides a method for forming a semiconductor device including a metal gate structure. A dielectric layer is formed on the surface of the substrate, and a trench is formed in the dielectric layer. A diffusion barrier layer is formed on surfaces of the sidewalls and bottom of the trench in the dielectric layer. The diffusion barrier layer includes a titanium-nitride stacked layer of TiNx, TiN, and TiNy, with x<1 and y>1. The trench is filled with a metallic material to form a metal gate in the trench.

Optionally, the titanium-nitride stacked layer is formed by forming a first titanium nitride layer on surfaces of the sidewalls and bottom of the trench, and the first titanium nitride layer is TiNx (x<1). The second titanium nitride layer is formed on the surface of the first titanium nitride layer, and the second titanium nitride layer is TiN. The third titanium nitride layer is formed on the surface of the second titanium nitride layer, and the third titanium nitride layer is TiNy (y>1).

Optionally, the first titanium nitride layer is formed by forming a first titanium layer on surfaces of the sidewalls and bottom of the trench, and then applying a first nitrogen plasma treatment to the first titanium layer to convert the first titanium layer into the first titanium nitride layer.

Optionally, the second titanium nitride layer is formed by forming the second titanium layer on the surface of the first titanium nitride layer, and then applying the second nitrogen plasma treatment to the second titanium layer to convert the second titanium layer into the second titanium nitride layer. The nitrogen flow rate used in the second nitrogen plasma treatment is greater than that used in the first nitrogen plasma treatment.

Optionally, the third titanium nitride layer is formed by forming a third titanium layer on the surface of the second titanium nitride layer, and then applying the third nitrogen plasma treatment to the third titanium layer to convert the third titanium layer into the third titanium nitride layer. The nitrogen flow rate used in the third nitrogen plasma treatment is greater than that used in the second nitrogen plasma treatment.

Optionally, the process of forming each of the first titanium layer, the second titanium layer, and the third titanium layer includes a physical vapor deposition. The conditions of the first nitrogen plasma treatment include a pressure ranging from about 0.01 Torr to about 10 Torr, a power of about 50 W to about 500 W, and a flow rate of about 100 sccm to about 500 sccm for a time duration of about 1 second to about 100 seconds. The conditions of the second nitrogen plasma treatment include a pressure ranging from about 0.01 Torr to about 10 Torr, a power of about 50 W to about 500 W, and a flow rate of about 500 sccm to about 1,000 sccm for a time duration of about 1 second to about 100 seconds. The conditions of the third nitrogen plasma treatment include a pressure ranging from about 0.01 Torr to about 10 Torr, a power of about 20 W to about 2,000 W, and a flow rate of about 1,000 sccm to about 2,000 sccm for a time duration of about 1 second to about 100 seconds.

Optionally, the diffusion barrier layer is formed by forming an aluminum titanium nitride layer on the surface of the titanium-nitride stacked layer, after the titanium nitride layer is formed.

Optionally, an aluminum titanium nitride layer is formed by forming a titanium aluminum alloy layer on the surface of the titanium-nitride stacked layer. Then a fourth nitrogen plasma treatment is applied to convert the titanium aluminum alloy layer into the aluminum titanium nitride layer.

Optionally, the conditions of the fourth nitrogen plasma treatment include a pressure ranging from about 0.01 Torr to about 10 Torr, a power of about 50 W to about 500 W, and a flow rate of about 100 sccm to about 500 sccm for a time duration of about 1 second to about 100 seconds.

Optionally, the diffusion barrier layer is also formed by forming a tantalum (Ta) layer on surfaces of the sidewalls and bottom of the trench before forming the titanium-nitride stacked layer. Optionally, the diffusion barrier layer is further formed by forming a tantalum nitride (TaN) layer on the surface of the tantalum (Ta) layer, after the tantalum (Ta) layer is formed but before the titanium-nitride stacked layer is formed.

Optionally, the trench in the dielectric layer is formed by forming a dummy gate on the substrate before forming the dielectric layer, and forming a dielectric layer coplanar with the surface of the dummy gate. The dummy gate is then removed to form the trench.

Optionally, before forming the diffusion barrier layer, a high K dielectric layer is formed on the bottom of the trench and is used as the gate dielectric layer of the metal gate structure.

As disclosed herein, the present disclosure has the following advantages. For example, in the metal gate structure of the resultant semiconductor device, the titanium-nitride stacked layer is formed as the diffusion barrier layer on surfaces of the sidewalls and bottom of the trench in the dielectric layer. The titanium-nitride stacked layer includes TiNx, TiN, and TiNy, with x<1 and y>1. Compared with conventional diffusion barrier layer, the titanium-nitride stacked layer is able to effectively reduce diffusion of the metal atoms from the metal gate into the dielectric layer. The desired diffusion prevention capability of the disclosed titanium-nitride stacked layer can improve performance of the resultant semiconductor device.

Figure 16:
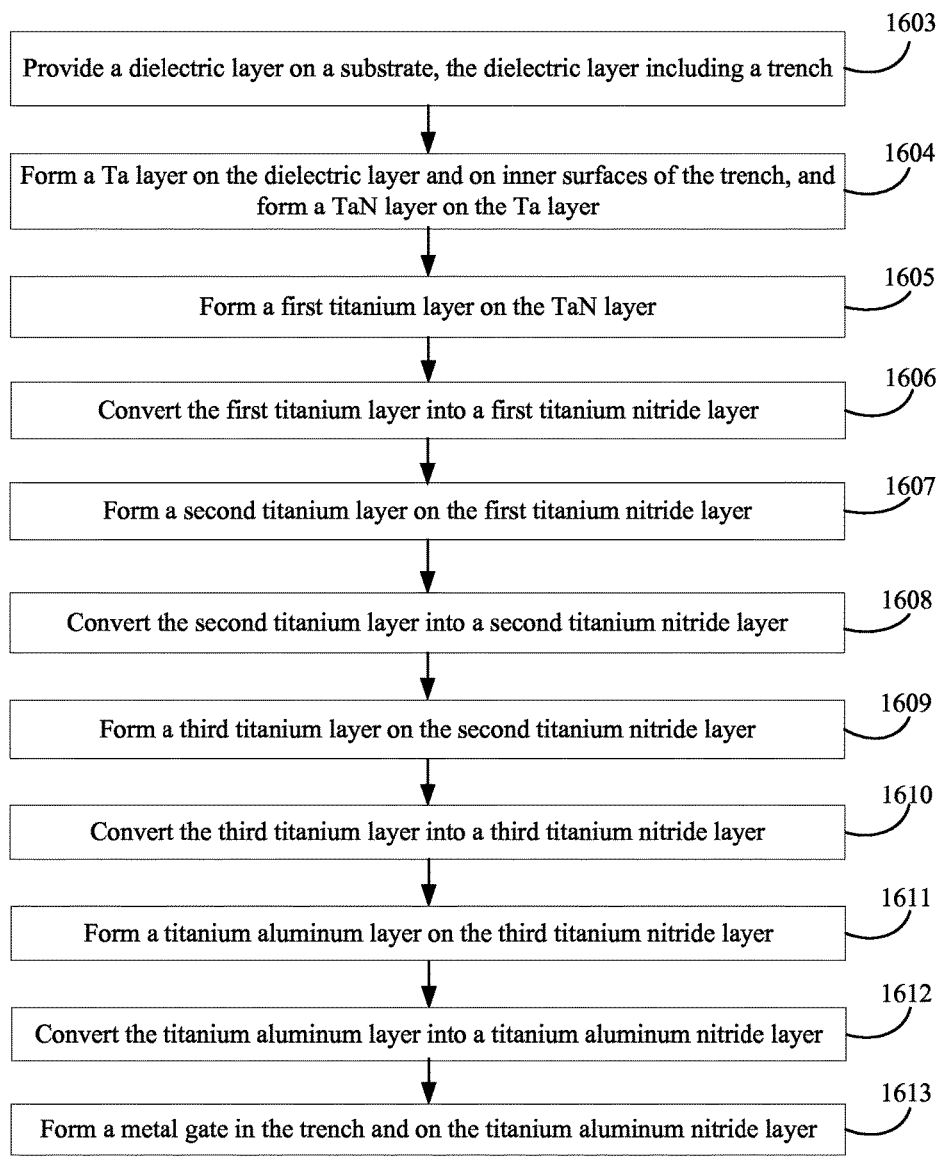
FIG. 16 illustrates an exemplary method for fabricating a semiconductor device including a metal gate structure consistent with various disclosed embodiments.

FIG. 16 illustrates an exemplary method for fabricating a semiconductor device including a metal gate structure, while FIG. 3 through FIG. 14 illustrate corresponding structures of the semiconductor device at certain stages during the exemplary formation method consistent with various disclosed embodiments.

Figure 3:
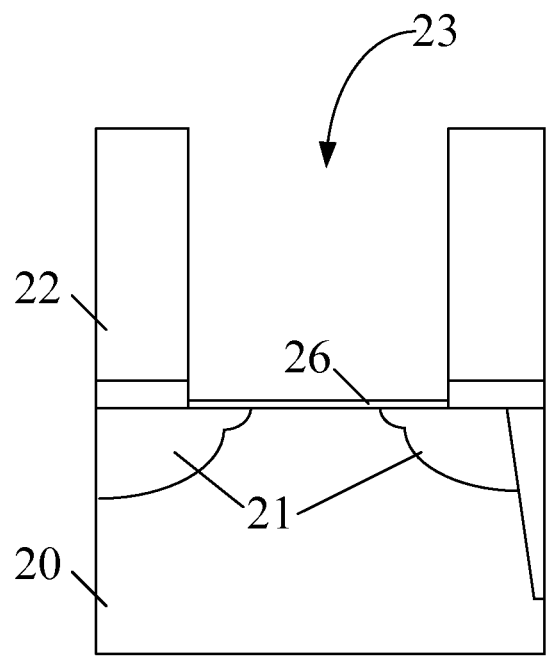
FIG. 3 through FIG. 14 are schematic diagrams illustrating a semiconductor device corresponding to certain stages during an exemplary formation method consistent with various disclosed embodiments.

Referring to FIG. 3, a substrate 20 is provided. A dielectric layer 22 is formed on the substrate 20. A trench 23 is formed in the dielectric layer 22 (e.g., in Step 1603 of FIG. 16). The trench 23 is used to subsequently form a metal gate.

In one embodiment, the substrate 20 includes a semiconductor substrate. Alternatively, the substrate 20 includes: a semiconductor substrate and semiconductor devices inside the semiconductor substrate or on the surface of the semiconductor substrate.

For example, the semiconductor substrate includes a silicon substrate, a silicon germanium substrate, a silicon carbide substrate, a silicon on insulator (SOI) substrate, a germanium on insulator (GOI) substrate, and/or a Group III-V substrate.

The dielectric layer 22 is made of a dielectric material, such as silicon oxide or any other suitable materials. According to various embodiments, materials used for the substrate and/or the dielectric layer 22 are not limited, and any suitable materials can be used as desired.

Source/drain regions 21 are formed in the substrate 20 around the peripheral of (and underneath) the trench 23, as shown in FIG. 3.

In one embodiment, the formation process of the metal gate structure includes a gate last process. To form the trench 23, a dummy gate is formed on the substrate 20 before forming the dielectric layer 22. The dielectric layer 22 is formed having a top surface coplanar with a top surface of the dummy gate. The dummy gate is then removed to form the trench.

For example, a polysilicon layer is formed on the substrate 20 and then etched to form a polysilicon dummy gate. The source/drain regions 21 around the peripheral of the polysilicon dummy gate are formed using an ion implantation process. A dielectric layer is formed on the substrate 20 to cover the polysilicon dummy gate, followed by chemical mechanical polishing (CMP) process to polish the dielectric layer such that top surfaces of the dielectric layer and the polysilicon dummy gate are coplanar. The polysilicon dummy gate is then removed to form the trench 23 in the remaining dielectric layer 22.

Optionally, after the trench 23 is formed, a high K dielectric layer 26 is formed on the bottom of the trench 23. The high K dielectric layer 26 is used as a gate dielectric layer. The high K dielectric layer 26 is made of a dielectric material such as hafnium oxide ($HfO_2$), titanium oxide ($TiO_2$), tantalum pentaoxide ($Ta_2O_5$), zirconia ($ZrO_2$), and/or the like. The formation process of the high K dielectric layer 26 includes an atomic layer deposition (ALD). According to various embodiments, materials used for the high K dielectric layer 26 are not limited, and any suitable materials can be used as desired. In one embodiment, the high k dielectric layer 26 is made of hafnium oxide ($HfO_2$).

Figure 4:
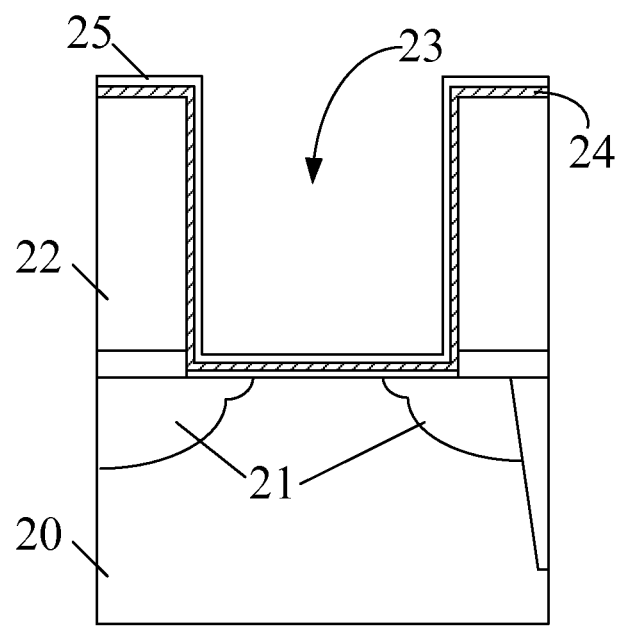

Referring to FIG. 4, a diffusion barrier layer is formed over surfaces of the sidewalls and bottom of the trench 23 (e.g., in Step 1604 of FIG. 16).

In one embodiment, the diffusion barrier layer includes a tantalum (Ta) layer and a tantalum nitride (TaN) layer. For example, before forming the titanium-nitride stacked layer, a tantalum (Ta) layer 24 is formed on the surface of the dielectric layer 22 and on the sidewalls and bottom of the trench 23 as shown in FIG. 4. Then a tantalum nitride (TaN) layer 25 is formed on the surface of the tantalum (Ta) layer 24.

In one embodiment, the process for forming the tantalum (Ta) layer 24 is a physical vapor deposition (PVD), such as magnetron sputtering.

To form the tantalum nitride (TaN) layer 25, another tantalum (Ta) layer is formed on the surface of the tantalum (Ta) layer 24 using the physical vapor deposition (PVD) process such as magnetron sputtering. Then a nitrogen plasma treatment is applied to this tantalum (Ta) layer on the tantalum (Ta) layer 24 to nitridize this tantalum (Ta) layer into a tantalum nitride (TaN) layer. Alternatively, while generating tantalum by magnetron sputtering on the tantalum (Ta) layer 24, nitrogen can be introduced to react with the generated tantalum directly to thereby form the tantalum nitride (TaN) layer 25 to cover the tantalum (Ta) layer 24. In various embodiments, any suitable methods for forming the tantalum (Ta) layer 24 and the tantalum nitride (TaN) layer 25 can be encompassed in the present disclosure without limitation.

The thickness of each of the tantalum (Ta) layer 24 and the tantalum nitride (TaN) layer 25 is between about 5 Å and about 50 Å.

Figure 8:
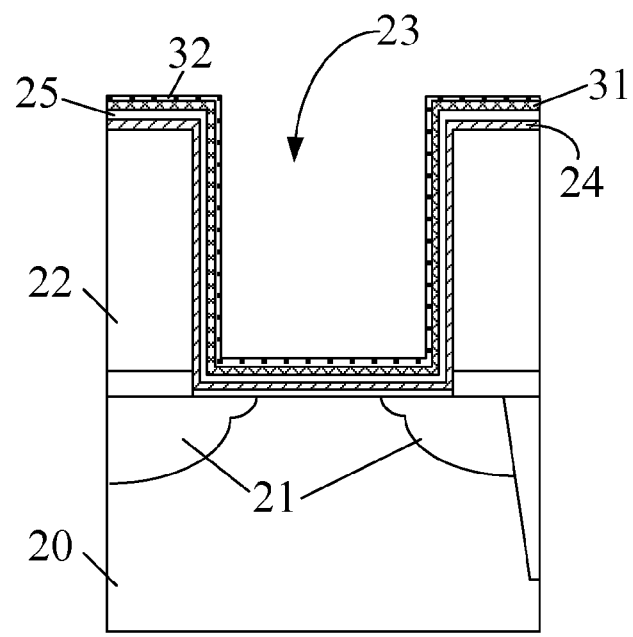
Figure 9:
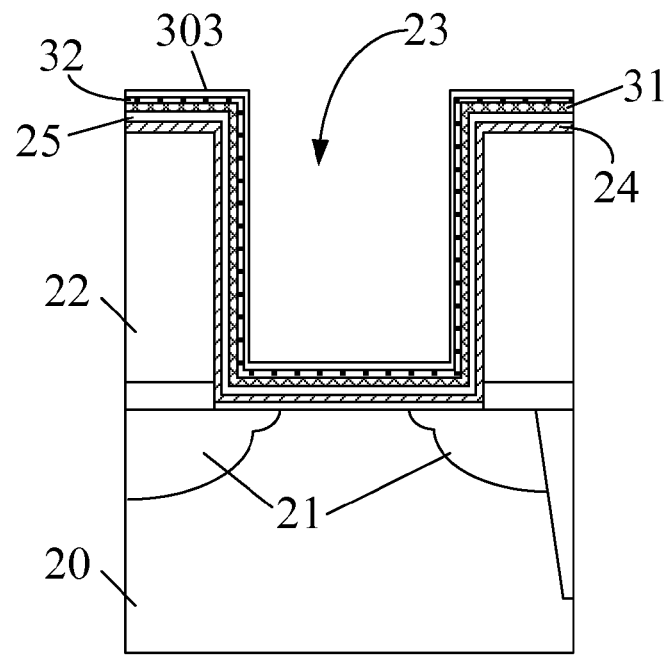
Figure 10:
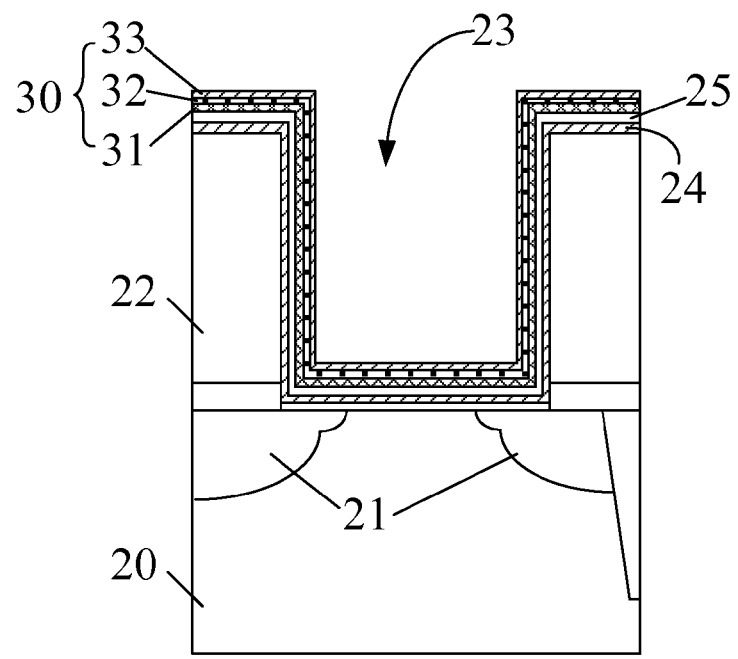

In one embodiment, referring to FIG. 5 through FIG. 10, the diffusion barrier layer is formed to include a titanium-nitride stacked layer 30 (as shown in FIG. 10). The titanium-nitride stacked layer 30 includes a TiNx layer formed over inner surfaces of the trench, a TiN layer on the TiNx layer, and a TiNy layer on the TiN layer, with x<1 and y>1. The titanium-nitride stacked layer 30 is thus able to more effectively reduce metal atom diffusion from the metal gate into the dielectric layer. Such diffusion barrier layer has superior diffusion blocking capability.

Figure 5:
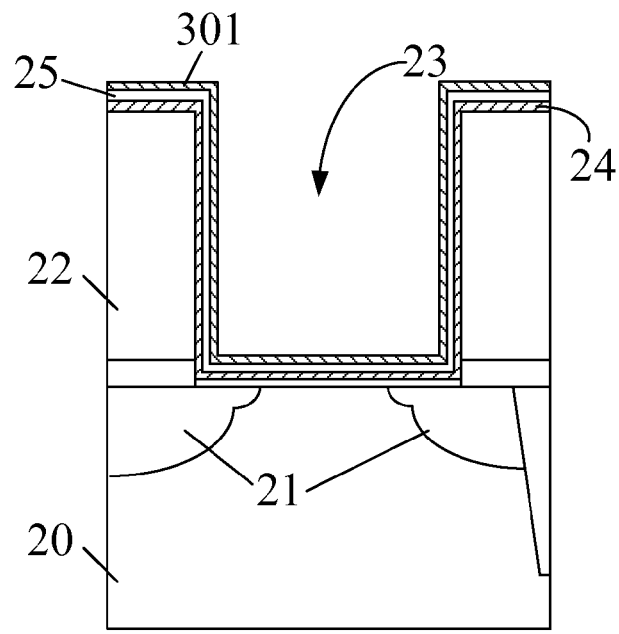

Note that although the titanium-nitride stacked layer 30 is formed on the surface of the tantalum nitride (TaN) layer 25 as illustrated in FIG. 5, in other embodiments, the titanium-nitride stacked layer 30 can be directly formed on the tantalum (Ta) layer 24 without forming the tantalum nitride (TaN) layer 25. In further embodiments, the tantalum (Ta) layer 24 and the tantalum nitride (TaN) layer 25 may not be included and the titanium-nitride stacked layer 30 may be directly formed on surfaces of the sidewalls and bottom of the trench 23. In this manner, the disclosed diffusion barrier layer may include the titanium-nitride stacked layer 30, with or without the tantalum (Ta) layer 24 and/or the tantalum nitride (TaN) layer 25. The tantalum nitride (TaN) layer 25 and/or the tantalum (Ta) layer 24 may further enhance the diffusion blocking effect, although the titanium-nitride stacked layer 30 provides sufficient diffusion blocking effect.

In one embodiment, the titanium-nitride stacked layer 30 may have a three-layer structure, including a first titanium nitride layer 31 covering the tantalum nitride (TaN) layer 25, a second titanium nitride layer 32 covering the first titanium nitride layer 31, and a third titanium nitride layer 33 covering the second titanium nitride layer 32. The first titanium nitride layer 31 can be a TiNx layer (x<1), the second titanium nitride layer 32 can be a TiN layer, and the third titanium nitride layer 33 can be a TiNy layer (y>1). The nitrogen content of the first titanium nitride layer 31, the second titanium nitride layer 32, and the third titanium nitride layer 33 is gradually increased (or in an ascending order).

To form the titanium-nitride stacked layer 30, a first titanium layer 301 is formed on the surface of the tantalum nitride (TaN) layer 25, as shown in FIG. 5 (e.g., in Step 1605 of FIG. 16).

In one embodiment, the first titanium layer 301 is formed by a PVD. For example, the first titanium layer 301 is formed to cover the surface of the tantalum nitride (TaN) layer 25 using a magnetron sputtering of PVD with a titanium (Ti) target.

Figure 6:
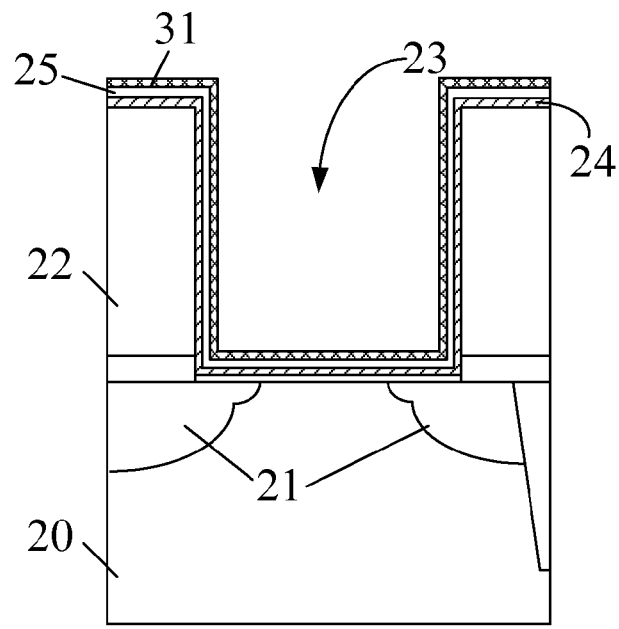

Referring to FIG. 6, a first nitrogen plasma treatment is applied to the first titanium layer 301 (e.g., in Step 1606 of FIG. 16). The nitrogen plasma allows nitrogen to react with the first titanium layer 301 to produce titanium nitride and thus to convert the first titanium layer 301 into a first titanium nitride layer 31. In the first titanium nitride layer 31, the percentage of the number of nitrogen atoms is less than the percentage of the number of titanium atoms.

In one embodiment, the thickness of the first titanium nitride layer 31 is between about 5 Å and about 60 Å. When the first titanium nitride layer 31 is too thick, negative impact may be generated to the dimension of the subsequently formed metal gate. When the first titanium nitride layer 31 is too thin, the overall metal atom diffusion blocking capability of the subsequently formed diffusion barrier layer may be affected.

In one embodiment, after the tantalum nitride (TaN) layer 25 is covered with a desired thickness of the first titanium layer 301, the nitrogen plasma treatment can be performed on the first titanium layer 301 to form the first titanium nitride layer 31 at a pressure ranging from about 0.01 Torr to about 10 Torr, a power of about 50 W to about 500 W, and a flow rate of about 100 sccm to about 500 sccm for a time duration of about 1 second to about 100 seconds.

During an exemplary process of the first nitrogen plasma treatment, when the gas pressure is too low, the nitrogen content in the reaction chamber can be reduced. The reduced nitrogen content may not help the nitrogen plasma react with the first titanium layer 301. The resultant first titanium nitride layer 31 may have nitrogen content lower than that is needed. In the case when the gas pressure is too high, the nitrogen content in the reaction chamber can be increased. The increased nitrogen content may cause the nitrogen plasma to overly react with the first titanium layer 301. The resultant first titanium nitride layer 31 may have the nitrogen content higher than that is needed.

In some cases, when the power is too low, the plasmazation (e.g., ionization) of nitrogen is insufficient to nitridize the first titanium layer 301. When the power is too high, the nitrogen plasmazation is overly performed and concentration of the nitrogen plasma is too high. The resultant first titanium nitride layer 31 may have nitrogen content higher than that is needed.

Note that the conditions of the first nitrogen plasma treatment may be set according to specific application requirements, for example, according to a thickness of the first titanium layer 301 and pre-set nitrogen content in the first titanium nitride layer 31.

Next, a second titanium nitride layer 32 is formed on the surface of the first titanium nitride layer 31 while the percentage of the number of nitrogen atoms of the second titanium nitride layer 32 is greater than the percentage of the number of nitrogen atoms of the first titanium nitride layer 31.

Figure 7:
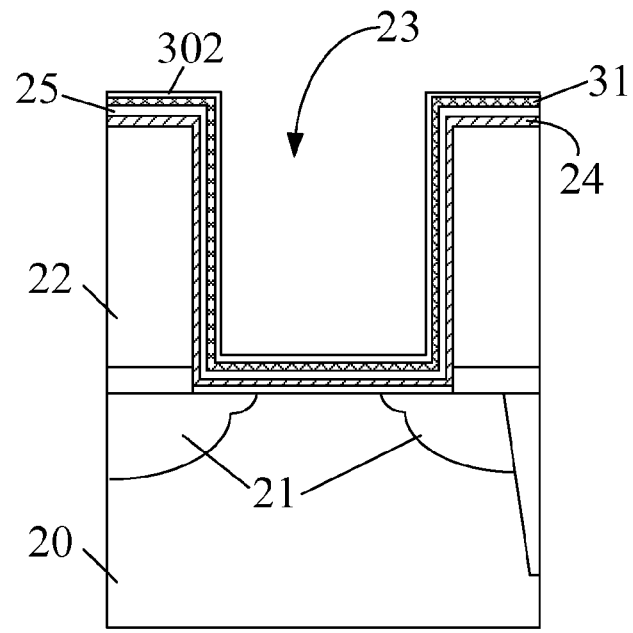

The process for forming the second titanium nitride layer 32 is as follows. Referring to FIG. 7, a second titanium layer 302 is formed on the surface of the first titanium nitride layer 31 (e.g., in Step 1607 of FIG. 16).

In one embodiment, the second titanium layer 302 is formed by PVD. For example, the second titanium layer 302 may be formed to cover the surface of the first titanium nitride layer 31 using magnetron sputtering with a titanium target.

Next, referring to FIG. 8, a second nitrogen plasma treatment is applied to the second titanium layer 302 (e.g., in Step 1608 of FIG. 16). The nitrogen plasma reacts with the second titanium layer 302 to form titanium nitride and to convert the second titanium layer 302 into the second titanium nitride layer 32. The nitrogen flow rate used in the second nitrogen plasma treatment is greater than that used in the first nitrogen plasma treatment. In one embodiment, the thickness of the second titanium nitride layer 32 is between about 5 Å and about 60 Å.

In one embodiment, the percentage of the number of nitrogen atoms of the second titanium nitride layer 32 is close to the percentage of the number of titanium atoms of the second titanium nitride layer 32. In one example, the percentage of the number of nitrogen atoms of the second titanium nitride layer 32 is equal to the percentage of the number of titanium atoms of the second titanium nitride layer 32.

An exemplary second nitrogen plasma treatment can be performed to the second titanium layer 302 having a thickness on the first titanium nitride layer 31, at a pressure ranging from about 0.01 Torr to about 10 Torr, a power of about 50 W to about 500 W, and a flow rate of about 500 sccm to about 1,000 sccm for a time duration of about 1 second to about 100 seconds.

Note that the conditions of the second nitrogen plasma treatment may be set according to specific application requirements, for example, according to the thickness of the second titanium layer 302 and pre-set nitrogen content of the second titanium nitride layer 32.

Referring to FIG. 9 and FIG. 10, a third titanium nitride layer 33 is formed on the surface of the second titanium nitride layer 32. The percentage of the number of nitrogen atoms in the third titanium nitride layer 33 is greater than the percentage of the number of titanium atoms in the third titanium nitride layer 33.

To form the third titanium nitride layer 33, a third titanium layer 303 is formed on the surface of the second titanium nitride layer 32 as shown in FIG. 9 (e.g., in Step 1609 of FIG. 16).

In one embodiment, the third titanium layer 303 is formed by PVD. For example, the third titanium layer 303 is formed to cover the surface of the second titanium nitride layer 32 using magnetron sputtering with a titanium target.

Next, referring to FIG. 10, a third nitrogen plasma treatment is applied to the third titanium layer 303 (e.g., in Step 1610 of FIG. 16). The nitrogen plasma reacts with the third titanium layer 303 to form titanium nitride to convert the third titanium layer 303 into the third titanium nitride layer 33. The nitrogen flow rate in the third nitrogen plasma treatment is greater than that in the second nitrogen plasma treatment, and the percentage of the number of nitrogen atoms of the third titanium nitride layer 33 is greater than the percentage of the number of titanium atoms of the third titanium nitride layer 33. In one embodiment, the thickness of the third titanium nitride layer 33 is between about 5 Å and about 60 Å.

An exemplary third nitrogen plasma treatment may be performed to the third titanium layer 303 having a thickness on the second titanium nitride layer 32 at a pressure ranging from about 0.01 Torr to about 10 Torr, a power of about 20 W to about 2,000 W, and a flow rate of about 1,000 sccm to about 2,000 sccm for a time duration of about 1 second to about 100 seconds.

The conditions of the third nitrogen plasma treatment may be set according to actual needs, for example, according to the thickness of the third titanium layer 303 and per-set nitrogen content of the third titanium nitride layer 33.

Note that although the titanium-nitride stacked layer 30 has a three-layer structure illustrated as an example, in various embodiments, the titanium-nitride stacked layer can include four or more layers. The percentage of the number of the nitrogen atoms in each layer of the four or more layers of the titanium-nitride stacked layer increases from an innermost layer close to the trench surface (i.e., inner surface of the trench) to an outermost layer distant from the trench surface. The percentage of the number of nitrogen atoms in the innermost titanium nitride layer is smaller than the percentage of the number of titanium atoms in the same titanium nitride layer (i.e., $TiN_x$, $x<1$), and the percentage of the number of nitrogen atoms in the outermost titanium nitride layer is greater than the percentage of the number of titanium atoms in the same titanium nitride layer (i.e., $TiN_y$, $y>1$).

Alternatively, the titanium-nitride stacked layer may have a single layer structure including $TiN_x$, $TiN$ and $TiN_y$ ($x<1$ and $y>1$) configured to have a $TiN_x$ portion/layer close to the trench surface and to have a $TiN_y$ portion/layer distant from the trench surface. In other words, in the single layer structure of the titanium-nitride stacked layer, the percentage of the number of the nitrogen atoms increases in a direction from close to the trench surface to distant from the trench surface.

For example, the percentage of the number of nitrogen atoms in the innermost portion/layer of the titanium-nitride stacked layer is lower than the percentage of the number of titanium atoms in the same portion/layer of the titanium-nitride stacked layer. The percentage of the number of nitrogen atoms in the outermost portion/layer of the titanium-nitride stacked layer is greater than the percentage of the number of titanium atoms in the same portion/layer of the titanium-nitride stacked layer. The percentage of the number of nitrogen atoms of a center portion/layer of the titanium-nitride stacked layer is the same as the percentage of the number of titanium atoms in the same portion/layer of the titanium-nitride stacked layer.

The single layer structure of the titanium-nitride stacked layer may be formed using a chemical vapor deposition (CVD) process with one source gas containing titanium and another source gas containing nitrogen, both used as reactant gases. By adjusting the amount of the titanium-containing source gas and the nitrogen-containing source gas, the titanium-nitride stacked layer with specific content and content distribution of nitrogen and titanium is formed in each of the innermost, center, and outermost portions/layers of the single layer structure. Alternatively, a physical vapor deposition (PVD) may be used to form a titanium layer while at the same time nitrogen gas or other suitable source gas containing nitrogen is passed by to allow nitrogen to react with the titanium layer to form a titanium-nitride stacked layer having a single layer structure. By adjusting the amount of the titanium-containing source gas and the nitrogen-containing source gas, the titanium-nitride stacked layer is formed with specific nitrogen and titanium content or content distribution in each of the innermost, center, and outermost portions/layers of the single layer structure.

Figure 11:
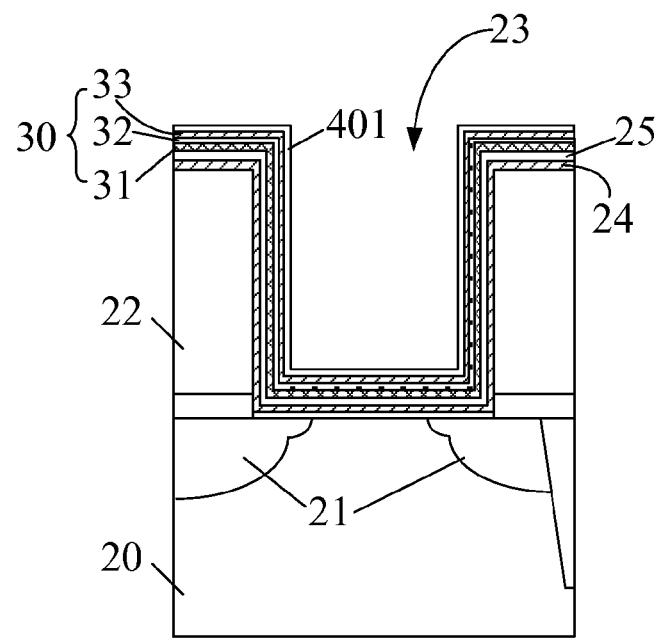
Figure 12:
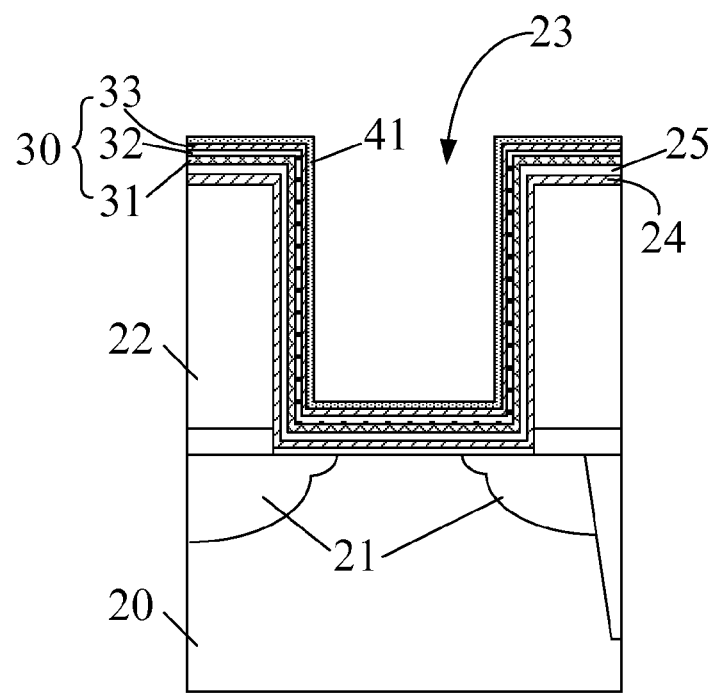

Referring to FIG. 11 and FIG. 12, in one embodiment, the diffusion barrier layer further includes a titanium aluminum nitride (TiAlN) layer 41 formed on top of the titanium-nitride stacked layer.

To form the titanium aluminum nitride (TiAlN) layer 41, referring to FIG. 11, a titanium aluminum layer 401 is formed on the surface of the titanium-nitride stacked layer (e.g., in Step 1611 of FIG. 16).

In one embodiment, the titanium aluminum layer 401 is formed by a physical vapor deposition (PVD). For example, the titanium aluminum layer 401 is formed on the surface of the titanium-nitride stacked layer 30 using magnetron sputtering with a titanium aluminum target.

Then, referring to FIG. 12, a fourth nitrogen plasma treatment is applied to the titanium aluminum layer 401 to convert the titanium aluminum layer 401 into the titanium aluminum nitride layer 41 (e.g., in Step 1612 of FIG. 16). In one embodiment, the thickness of the titanium aluminum nitride layer 41 is between about 5 Å and about 50 Å.

In one embodiment, the titanium aluminum nitride layer 41 may help improve the bonding strength between the titanium-nitride stacked layer 30 and the subsequently formed metal gate. Further, the titanium aluminum nitride layer 41 enhances the overall diffusion blocking capability of the diffusion barrier layer. In some cases, the titanium aluminum nitride layer 41 may not be included.

As discussed above, the tantalum (Ta) layer 24 and the tantalum nitride (TaN) layer 25 also help enhance the overall diffusion blocking capability of the diffusion barrier layer. According to various embodiments, each of the titanium aluminum nitride (TiAlN) layer 41, the tantalum (Ta) layer 24, and the tantalum nitride (TaN) layer 25 is optional.

Figure 13:
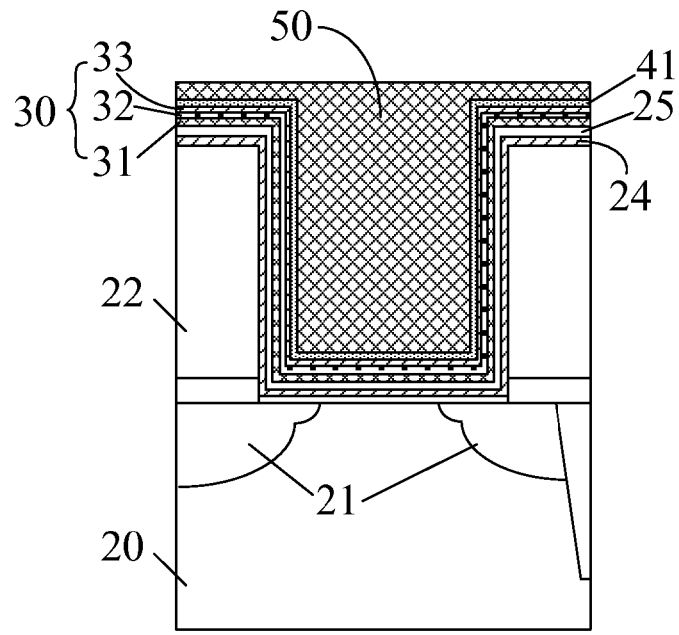

Referring to FIG. 13, after the diffusion barrier layer is formed, a metal material 50 is formed on the dielectric layer 22 (e.g., in Step 1613 of FIG. 16). The metal material 50 fills up the trench 23.

Figure 14:
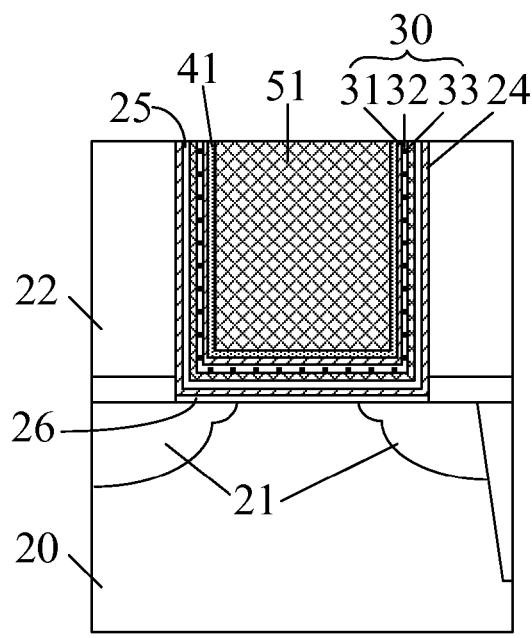

Referring to FIG. 14, a chemical mechanical polishing (CMP) or other similar processes may be used to remove excessive metal material 50 and the diffusion barrier layer from the dielectric layer 22 to expose the surface of the dielectric layer 22. A metal gate 51 is then formed in the trench 23 after the exemplary CMP process.

In one embodiment, the metal material is aluminum, and the metal gate 51 is an aluminum gate. However, in other embodiments, the metal gate can use any other suitable metallic materials. The use of other metallic materials does not limit the scope of the present disclosure.

Further referring to FIG. 14, the present disclosure provides an exemplary semiconductor device having a metal gate structure. The exemplary semiconductor device having the metal gate structure can be formed using the disclosed method or any suitable methods.

For example, the metal gate structure includes a substrate 20, a dielectric layer 22 on the substrate 20 and a trench (not shown) in the dielectric layer 22, and a diffusion barrier layer covering surfaces of the sidewalls and bottom of the trench. The diffusion barrier layer includes at least a titanium-nitride stacked layer 30. The titanium-nitride stacked layer 30 includes a $TiN_x$ layer disposed over trench surfaces, a TiN layer on the $TiN_x$ layer, and a $TiN_y$ layer on the TiN layer ($x<1$ and $y>1$). A metal gate 51 is formed in the trench and on the diffusion barrier layer.

Source/drain regions 21 are formed around the peripheral of the metal gate 51 in the substrate 20. In one embodiment, the metal gate structure further includes a high K dielectric layer 26 formed on the bottom of the trench and under the metal gate 51. The material of the high K dielectric layer 26 includes hafnium oxide (HfO$_2$), titanium oxide (TiO$_2$), tantalum pentaoxide (Ta$_2$O$_5$), zirconia (ZrO$_2$), and/or the like. The process for forming the high K dielectric layer 26 includes an atomic layer deposition (ALD). In an exemplary embodiment, the high k dielectric layer 26 includes hafnium oxide (HfO$_2$).

In one embodiment, the titanium-nitride stacked layer 30 includes: a first titanium nitride layer 31 of TiNx (x<1) having the percentage of the number of nitrogen atoms in the first titanium nitride layer 31 lower than the percentage of the number of titanium atoms in the same titanium nitride layer; a second titanium nitride layer 32 of (TiN) having the percentage of the number of nitrogen atoms of the second titanium nitride layer 32 close to or same as the percentage of the number of titanium atoms in the second titanium nitride layer 32 on the first titanium nitride layer 31; and a third titanium nitride layer 33 of TiNy (y>1) having the percentage of the number of nitrogen atoms in the third titanium nitride layer 33 greater than the percentage of the number of titanium atoms in the same titanium nitride layer 33 on the second titanium nitride layer 32.

The thickness of each of the first titanium nitride layer, the second titanium nitride layer and the third titanium nitride layer is between about 5 Å and about 60 Å.

In one embodiment, the diffusion barrier layer further includes a titanium aluminum nitride layer 41 on the surface of the titanium-nitride stacked layer 30. The thickness of the titanium aluminum nitride layer 41 is between about 5 Å and about 50 Å.

Optionally, the diffusion barrier layer further includes a tantalum (Ta) layer 24 on surfaces of the sidewalls and bottom of the trench 23. The titanium-nitride stacked layer 30 is formed above the tantalum (Ta) layer 24.

Optionally, the diffusion barrier layer includes a tantalum nitride (TaN) layer 25 disposed between the tantalum (Ta) layer 24 and the titanium-nitride stacked layer 30. The thickness of each of the tantalum (Ta) layer 24 and the tantalum nitride (TaN) layer 25 is between about 5 Å and about 50 Å.

Figure 15:
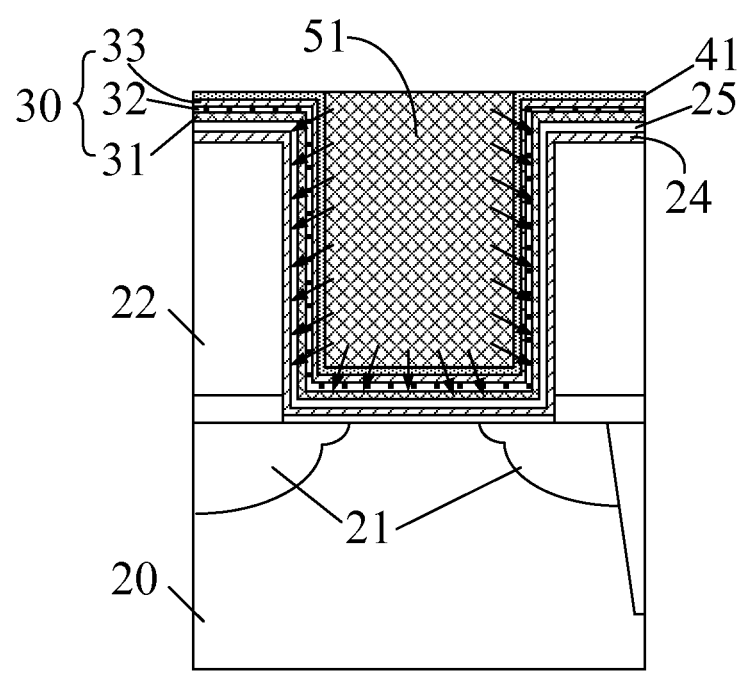
FIG. 15 is a schematic diagram illustrating a semiconductor device including a metal gate structure consistent with various disclosed embodiments.

Referring to FIG. 15, in one embodiment, the diffusion barrier layer provided herein includes stacked layers of the tantalum (Ta) layer 24, the tantalum nitride (TaN) layer 25, the first titanium nitride layer 31, the second titanium nitride layer 32, the third titanium nitride layer 33, and the aluminum titanium nitride layer 41. Such diffusion barrier layer can be formed on inner surfaces of the bottom and sidewalls of the trench 23 as shown in FIG. 3.

Located on the surface of the aluminum titanium nitride layer 41, the metal gate 51 fills the trench 23 in the dielectric layer 22 completely. In one embodiment, the metal gate 51 can be an aluminum gate.

The exemplary aluminum atoms of the metal gate 51 may often be easy to spread into the dielectric layer 22 in a direction shown by arrows in FIG. 15. However, the disclosed diffusion barrier layer can effectively suppress the diffusion of exemplary aluminum atoms from the metal gate to the dielectric layer. Of course, the disclosed diffusion barrier layer that at least includes the titanium-nitride stacked layer 30 (e.g., including the first titanium nitride layer 31, the second titanium nitride layer 32, and the third titanium nitride layer 33) can improve blocking effectiveness of metal atom diffusion and can improve performance of the metal gate structure.

Note that, in other embodiments, the titanium-nitride stacked layer can be a structure including four or more layers, while the percentage of the number of the nitrogen atoms in each layer of the titanium-nitride stacked layer increases from an innermost layer close to the trench surface to an outermost layer distant from the trench surface. The percentage of the number of nitrogen atoms in the innermost titanium nitride layer is smaller than the percentage of the number of titanium atoms in the same titanium nitride layer (i.e., TiNx, x<1), and the percentage of the number of nitrogen atoms in the outermost titanium nitride layer is greater than the percentage of the number of titanium atoms in the same titanium nitride layer (i.e., TiNy, y>1).

Alternatively, the titanium-nitride stacked layer may have a single layer structure including TiNx, TiN and TiNy (x<1 and y>1) configured to have a TiNx portion/layer close to the trench surface and to have a TiNy portion/layer distant from the trench surface. In other words, in the single layer structure of the titanium-nitride stacked layer, the percentage of the number of the nitrogen atoms increases in a direction from close to the trench surface to distant from the trench surface.

For example, the percentage of the number of nitrogen atoms in the innermost portion/layer of the titanium-nitride stacked layer is lower than the percentage of the number of titanium atoms in the same portion/layer of the titanium-nitride stacked layer. The percentage of the number of nitrogen atoms in the outermost portion/layer of the titanium-nitride stacked layer is greater than the percentage of the number of titanium atoms in the same portion/layer of the titanium-nitride stacked layer. The percentage of the number of nitrogen atoms of a center portion/layer of the titanium-nitride stacked layer is the same as the percentage of the number of titanium atoms in the same portion/layer of the titanium-nitride stacked layer.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:
1. A method for fabricating a semiconductor device, comprising:
  providing a substrate;
  forming a dielectric layer on the substrate;
  forming a trench in the dielectric layer;
  forming a diffusion barrier layer, comprising:
    forming a first titanium nitride layer over a bottom surface and sidewall surfaces of the trench in the dielectric layer by performing a first nitrogen plasma treatment at a pressure ranging from about 0.01 Torr to about 10 Torr, a power ranging from about 50 W to about 500 W, and a flow rate ranging from about 100 sccm to about 500 sccm for a time duration ranging from about 1 second to about 100 seconds;
    forming a second titanium nitride layer on the first titanium nitride layer by performing a second nitrogen plasma treatment at a pressure ranging from about 0.01 Torr to about 10 Torr, a power ranging from about 50 W to about 500 W, and a flow rate ranging from about 500 sccm to about 1,000 sccm for a time duration ranging from about 1 second to about 100 seconds; and forming a third titanium nitride layer on the second titanium nitride layer by performing a third nitrogen plasma treatment is performed at a pressure ranging from about 0.01 Torr to about 10 Torr, a power ranging from about 20 W to about 2,000 W, and a flow rate ranging from about 1,000 sccm to about 2,000 sccm for a time duration ranging from about 1 second to about 100 seconds; and filling the trench with a metallic material to form a metal gate in the trench and on the diffusion barrier layer.

2. The method according to claim 1, wherein
forming the first titanium nitride layer includes forming a TiNx layer;
forming the second titanium nitride layer includes forming a TiN layer; and
forming the third titanium nitride layer includes forming a TiNy layer, wherein x<1 and y>1.

3. The method according to claim 2, wherein:
the first titanium nitride layer is formed by:
    forming a first titanium layer over the bottom surface and the sidewall surfaces of the trench in the dielectric layer, and
    applying the first nitrogen plasma treatment to the first titanium layer to convert the first titanium layer into the first titanium nitride layer;
the second titanium nitride layer is formed by:
    forming a second titanium layer on the first titanium nitride layer, and
    applying the second nitrogen plasma treatment to the second titanium layer to convert the second titanium layer into the second titanium nitride layer, wherein a nitrogen flow rate used in the second nitrogen plasma treatment is greater than a nitrogen flow rate used in the first nitrogen plasma treatment; and
the third titanium nitride layer is formed by:
    forming a third titanium layer on the second titanium nitride layer, and
    applying the third nitrogen plasma treatment to the third titanium layer to convert the third titanium layer into the third titanium nitride layer, wherein a nitrogen flow rate used in the third nitrogen plasma treatment is greater than the nitrogen flow rate used in the second nitrogen plasma treatment.

4. The method according to claim 3, wherein the steps of forming the first titanium layer, the second titanium layer, and the third titanium layer include a physical vapor deposition.

5. The method according to claim 1, wherein the step of forming the diffusion barrier layer further includes:
    forming an aluminum titanium nitride layer on the third titanium nitride layer.

6. The method according to claim 5, wherein the step of forming the aluminum titanium nitride layer includes:
    forming a titanium aluminum layer on the third titanium nitride layer; and
    applying a fourth nitrogen plasma treatment to the titanium aluminum layer to convert the titanium aluminum layer into the aluminum titanium nitride layer.

7. The method according to claim 6, wherein the fourth nitrogen plasma treatment is performed at a pressure ranging from about 0.01 Torr to about 10 Torr, a power ranging from about 50 W to about 500 W, and a flow rate ranging from about 100 sccm to about 500 sccm for a time duration ranging from about 1 second to about 100 seconds.

8. The method according to claim 1, wherein the step of forming the diffusion barrier layer further includes:
    forming a tantalum layer over the bottom surface and the sidewall surfaces of the trench in the dielectric layer before forming the first titanium nitride layer.

9. The method according to claim 8, wherein the step of forming the diffusion barrier layer further includes:
    forming a tantalum nitride layer on the tantalum layer, and
    forming the first titanium nitride layer on the tantalum nitride (TaN) layer.

10. The method according to claim 1, wherein the step of forming the trench in the dielectric layer includes:
    forming a dummy gate over the substrate prior to forming the dielectric layer;
    forming the dielectric layer on the substrate and having a top surface coplanar with a top surface of the dummy gate; and
    removing the dummy gate to form the trench in the dielectric layer.

11. The method according to claim 1, before forming the diffusion barrier layer, further including:
    forming a high K dielectric layer on the bottom surface of the trench, wherein the high K dielectric layer is used as a gate dielectric layer for the metal gate.

12. The method according to claim 1, wherein the diffusion barrier layer is formed by a chemical vapor deposition (CVD) process or a physical vapor deposition (PVD) using a first source gas containing titanium and a second source gas containing nitrogen.

* * * * *